United States Patent
Chen et al.

(10) Patent No.: US 7,791,211 B2
(45) Date of Patent: Sep. 7, 2010

(54) FLIP CHIP PACKAGE STRUCTURE AND CARRIER THEREOF

(75) Inventors: Jen-Chuan Chen, Taoyuan County (TW); Chi-Chih Shen, Kaohsiung City (TW); Hui-Shan Chang, Taoyuan County (TW); Tommy Pan, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 70 days.

(21) Appl. No.: 12/228,683

(22) Filed: Aug. 15, 2008

(65) Prior Publication Data

US 2009/0102047 A1      Apr. 23, 2009

(30) Foreign Application Priority Data

Oct. 19, 2007    (TW) .............................. 96139335 A

(51) Int. Cl.
H01L 23/48    (2006.01)
H01L 23/52    (2006.01)
H01L 29/40    (2006.01)

(52) U.S. Cl. ...................................... 257/784; 257/786

(58) Field of Classification Search ................. 257/778, 257/784, 786
See application file for complete search history.

(56) References Cited

U.S. PATENT DOCUMENTS

2005/0098886 A1 *  5/2005  Pendse ..................... 257/738
2005/0248037 A1 * 11/2005  Hung et al. ................ 257/778

\* cited by examiner

*Primary Examiner*—S. V Clark
(74) *Attorney, Agent, or Firm*—J.C. Patents

(57) ABSTRACT

A flip chip package structure including a chip, a carrier, and a plurality of bumps is provided. The chip has a bonding surface and a plurality of bump pads thereon. The carrier is disposed corresponding to the chip and includes a substrate and a plurality of pre-solders. The substrate has a carrying surface and a patterned trace layer thereon. The patterned trace layer has a plurality of traces, and each of the traces has an outward protruding bonding portion corresponding to the bump. The line width of the bonding portion is greater than that of the trace. The pre-solders are disposed on the bonding portions, respectively. The bumps are disposed between the bump pads and the corresponding pre-solders such that the chip is electrically connected to the carrier through the bumps.

8 Claims, 6 Drawing Sheets

FLIP CHIP PACKAGE STRUCTURE AND CARRIER THEREOF

CROSS-REFERENCE TO RELATED APPLICATION

This application claims the priority benefit of Taiwan application serial no. 96139335, filed Oct. 19, 2007. The entirety of the above-mentioned patent application is hereby incorporated by reference herein and made a part of this specification.

BACKGROUND OF THE INVENTION

1. Field of the Invention

The present invention relates to a semiconductor package structure and a carrier thereof and more particularly, to a flip chip package structure and a carrier thereof.

2. Description of Related Art

The flip chip (FC) bonding technology is a package technology of bonding a die to a carrier in which a plurality of bumping pads are disposed on an active surface of a die in an area array and bumps are formed on the bumping pads. Then, the die is flipped and the bumping pads on the die surface are electrically and structurally connected to the contacts on the carrier through the bumps. As a result, the die is electrically connected to the carrier through the bumps and to external electronic devices through the internal circuits of the carrier. The FC bonding technology is suitable for a chip package structure with a high pin count and has many advantages such as reduced chip package area and shortened signal transmission paths. Thus, the FC bonding technology is currently widely used in the field of advanced chip packaging.

FIG. 1 is a schematic diagram of a conventional gold-tin flip chip package structure. Referring to FIG. 1, a gold-tin flip chip package structure 100 mainly comprises a chip 110, a carrier 120, and a plurality of gold stud bumps 130 connecting the chip 110 and the carrier 120. In the gold-tin flip chip package structure 100, the height of the gold stud bump 130 is low. Therefore, the gap between the chip 110 and the carriers 120 is reduced after the gold stud bump 130 is bonded with solder 122 on the carrier 120. In addition, a size of an opening of a solder mask 124 is usually designed to be larger than that of the chip 110 so as to facilitate the filling of the underfill in a following process.

In relation to the increase in the size of the opening of the solder mask 124, the length of the circuit connecting the solder mask 124 and the gold stud bump 130 becomes longer. However, the circuit has been coated with solder. Therefore, in the reflow process, the solder consolidates and bulges due to the cohesive force on the surface of the solder. FIG. 2 illustrates a distribution of where the solder consolidates of a conventional gold-tin flip chip package structure after the reflow process. The parts of bright oval shapes are the places where the solder 122 consolidates on the circuit after the reflow process. As shown in FIG. 2, the places where the solder 122 bulges are often not easily controlled and distribute irregularly. That is, the places where the solder 122 bulges on each circuit are mostly not the same.

However, referring to FIG. 3, if the places where the solder 122 bulges are away from the gold stud bump 130, it often results in a poor bonding of gold and tin and further reduces the yield of the gold-tin flip chip package structure.

SUMMARY OF THE INVENTION

The purpose of the present invention is to provide a flip chip package structure and a carrier thereof to solve the problem of poor bonding between gold and tin resulted from the displacement of the solder bulges from the bumps in the conventional technology.

For the above purpose and others, the present invention provides a carrier suitable for a flip chip package process with a chip on which a plurality of bump pads are disposed and each of the bump pads comprises a bump. The carrier comprises a substrate and a plurality of pre-solders. The substrate has a carrying surface and a patterned trace layer disposed thereon. The patterned trace layer has a plurality of traces, and each of the traces has an outward protruding bonding portion corresponding to the abovementioned bump. The line width of the bonding portion is greater than that of the trace. The pre-solders are disposed on the bonding portions, respectively.

In one embodiment of the present invention, the abovementioned bonding portion is not disposed at the end of the trace.

In one embodiment of the present invention, the abovementioned bonding portions and the main body of the trace form a cross-shaped structure.

In one embodiment of the present invention, the abovementioned carrier further comprises a solder mask disposed on the carrying surface of the substrate. The solder mask comprises an opening to expose the bonding portions of the patterned trace layer.

For the above purposes or others, the present invention further provides a flip chip package structure comprising a chip, a carrier, and a plurality of bumps. The chip has a bonding surface and a plurality of bump pads disposed on the bonding surface. The carrier is disposed corresponding to the chip and includes a substrate and a plurality of pre-solders. The substrate has a carrying surface to carry the chip and a patterned trace layer disposed on carrying surface. The patterned trace layer has a plurality of traces and each of the traces has an outward protruding bonding portion respectively corresponding to the bumps. The line width of the bonding portion is greater than that of the trace. The pre-solders are respectively disposed on the bonding portions. The bumps are disposed between the bump pads and the corresponding pre-solders such that the chip is electrically connected to the carrier through the bumps.

In one embodiment of the present invention, the bonding portion is not disposed at the end of the trace.

In one embodiment of the present invention, the bonding portions and the main body of the trace form a cross-shaped structure.

In one embodiment of the present invention, the bumps are stud bumps.

In one embodiment of the present invention, the carrier further comprises a solder mask disposed on the carrying surface of the substrate. The solder mask comprises an opening to expose the bonding portions of the patterned trace layer.

In one embodiment of the present invention, the flip chip package structure further comprises an underfill disposed between the chip and the carrier and covers the bumps.

The design of the flip chip package structure and the carrier mainly includes a protruding bonding portion of each of the traces of the carrier. The line width of the bonding portion is greater than that of the trace and the bonding portions are arranged along a straight line. The area of the bonding portion is larger and thus, the amount of solder that may be coated thereon is also larger. Thus, in a following reflow process, the solder has a larger cohesive force and bulges as well as consolidates at the same positions to precisely bonding with the bumps. As a result, the problem of poor gold-tin bonding resulted from unfixed places where the solder bulges in the conventional technology may be avoided and the yield of the flip chip package structure may be increased.

To make the above and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 4:
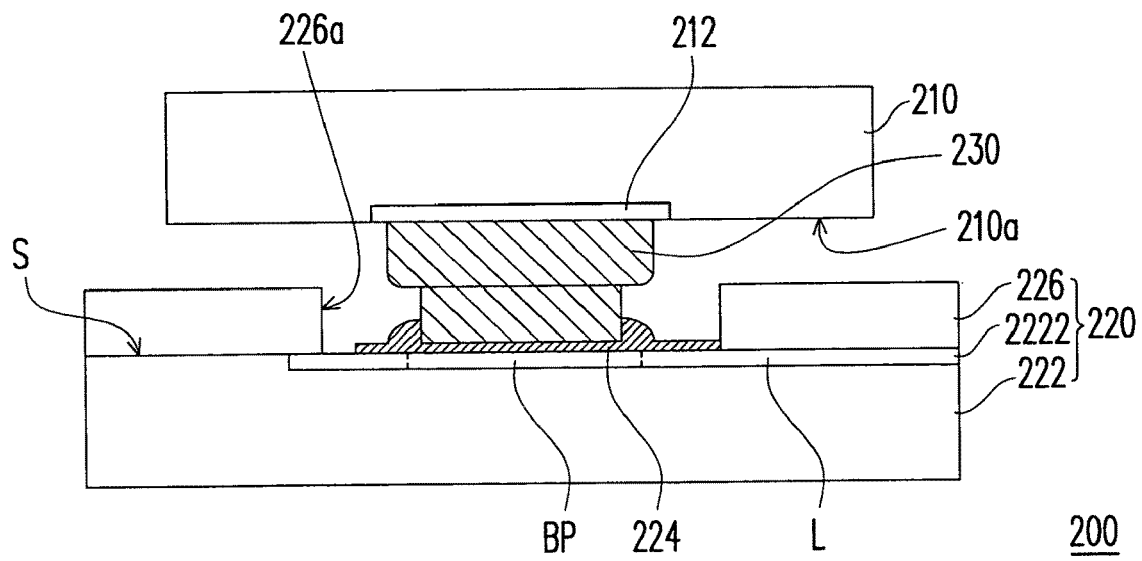
FIG. 4 is a schematic cross-sectional view of a flip chip package structure according to an embodiment of the present invention.
Figure 5:
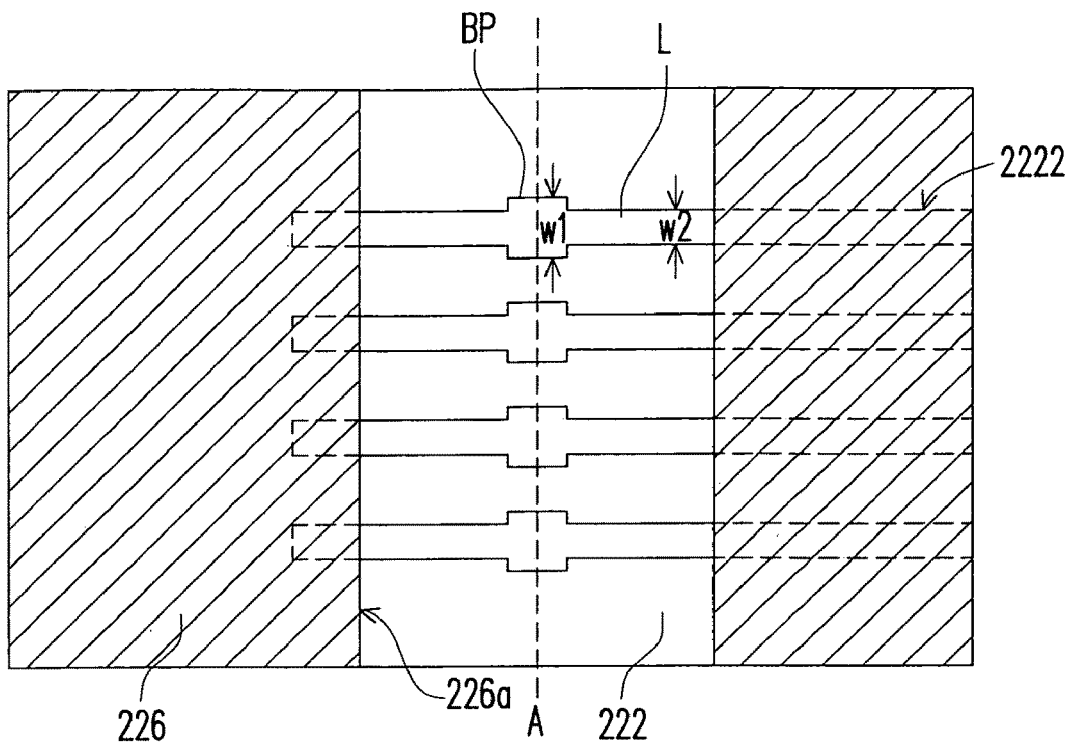
FIG. 5 is a schematic top view of the carrier of the flip chip package structure shown in FIG. 4.

FIG. 4 is a schematic cross-sectional view of a flip chip package structure according to an embodiment of the present invention. FIG. 5 is a schematic top view of a part of the patterned trace layer of the carrier of the flip chip package structure shown in FIG. 4. First, referring to FIG. 4, a flip chip package structure 200 of the present invention mainly comprises a chip 210, a carrier 220, and a plurality of bumps 230. The components of the flip chip package structure 200 and their relationship will be illustrated in connection with the figures below.

The chip 210 has a bonding surface 210a and a plurality of bump pads 212 disposed on the bonding surface 210a. The carrier 220 is disposed corresponding to the chip 210 and includes a substrate 222 and a plurality of pre-solders 224. The substrate 222 of the carrier 220 may be a single-layer substrate or a multi-layer substrate. Furthermore, the substrate 222 has a carrying surface S to carry the chip 210 and a patterned trace layer 2222 disposed on the carrying surface S.

As shown in FIG. 5, the patterned trace layer 2222 on the substrate 222 has a plurality of traces L, and each of the traces has an outward protruding bonding portion BP respectively corresponding to the bumps 230. The line width w1 of the bonding portion BP is greater than the line width w2 of the trace L. In addition, from FIG. 5, the bonding portions BP are arranged alone a straight line A. The main feature of the present invention is to design the line width w7 of the bonding portion BP to be greater than the line width w2 of the trace L. The area of the bonding portion BP is larger and thus, the amount of the solder that may be coated thereon is larger as well. Thus, in a following reflow process, the solder has a larger cohesive force and bulges as well as consolidates at the same positions to prevent the problem of poor bonding between gold and tin due to irregular places of bulges of the solder in the conventional technology.

Figure 6:
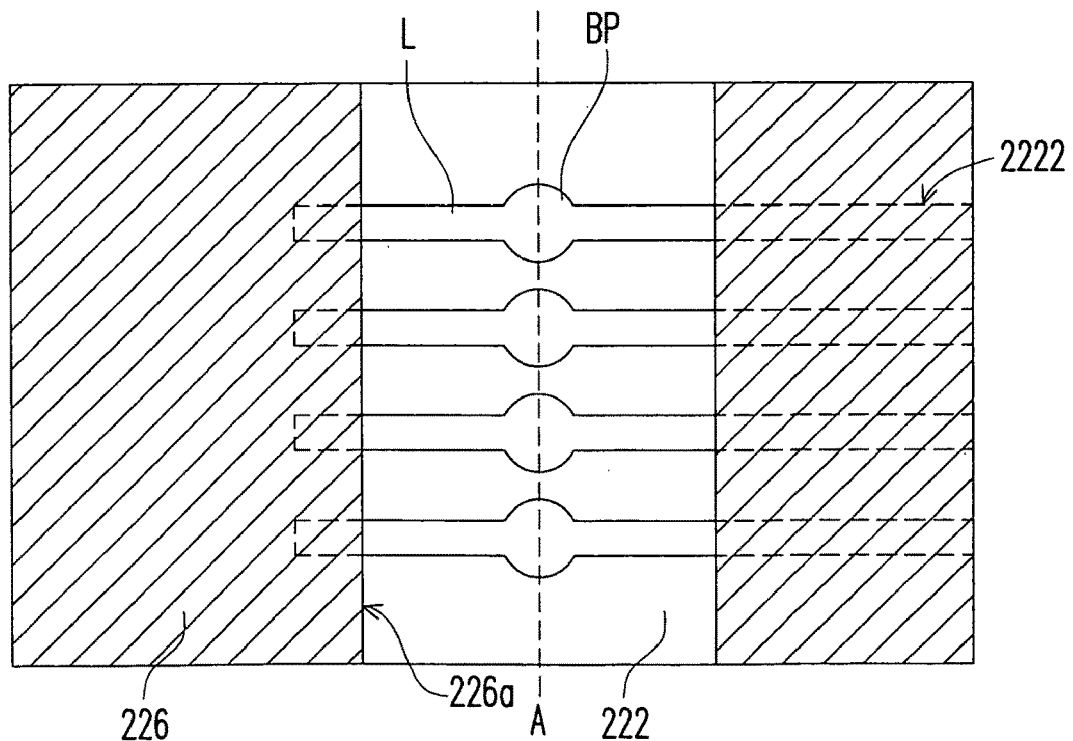
FIG. 6 is a schematic top view of traces having oval-shaped bonding portions.

In one embodiment of the present invention, the bonding portion BP is not disposed at the end of the trace L. In addition, as shown in FIG. 5, the bonding portions BP and the main body of the trace L may form a cross-shaped structure. Certainly, the shape of the bonding portions BP may be an oval as shown in FIG. 6 or other suitable shapes as long as the line width w1 of the bonding portion BP is greater than the line width w2 of the trace L. The shape of the bonding portions BP is not limited herein by the present invention. The pre-solders 224 are respectively disposed on the bonding portions BP. The bumps 230 are respectively disposed between the bump pads 212 of the chip 210 and the corresponding pre-solders 224 on the carrier 220 so as to electrically connect the chip 210 and the carrier 220 through the bumps 230. In one embodiment of the present invention, the bumps 230 may be stud bumps. In addition, the carrier 220 further comprises a solder mask 226 disposed on the carrying surface S of the substrate 222. The solder mask 226 comprises an opening 226a to expose the bonding portions BP of the patterned trace layer 2222.

Figure 7:
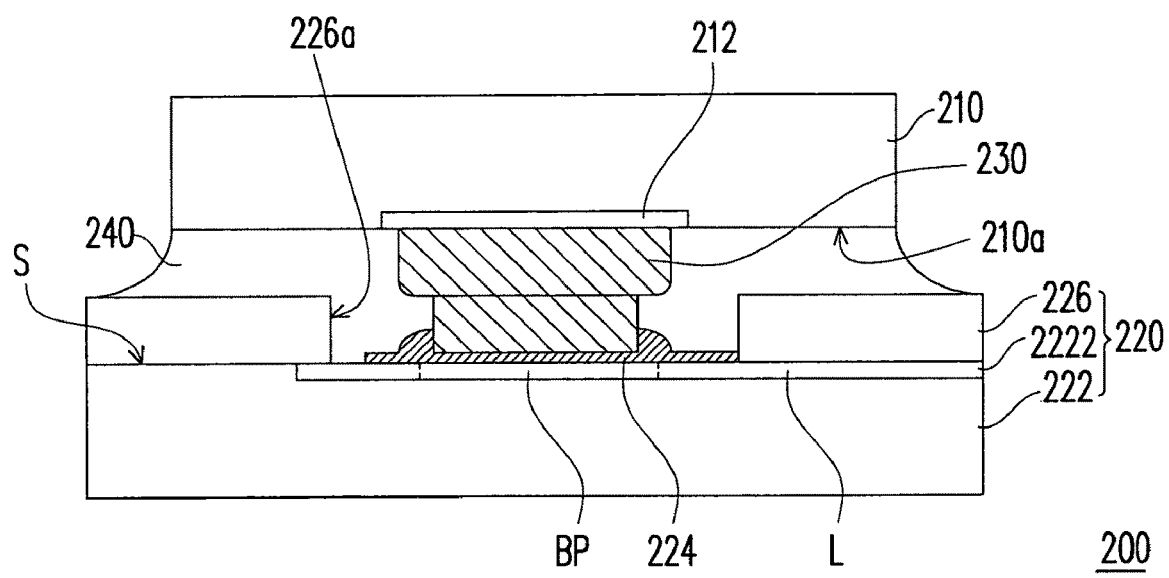
FIG. 7 is a schematic cross-sectional illustrating filling an underfill between the chip and the carrier shown in FIG. 4.

In addition, to prevent the bumps 230 shown in FIG. 4 from damage and moisture, as shown in FIG. 7, an underfill 240 may be filled between the chip 210 and the carrier 220. The underfill 240 covers the bumps 230 for protection from damage and moisture.

Figure 1:
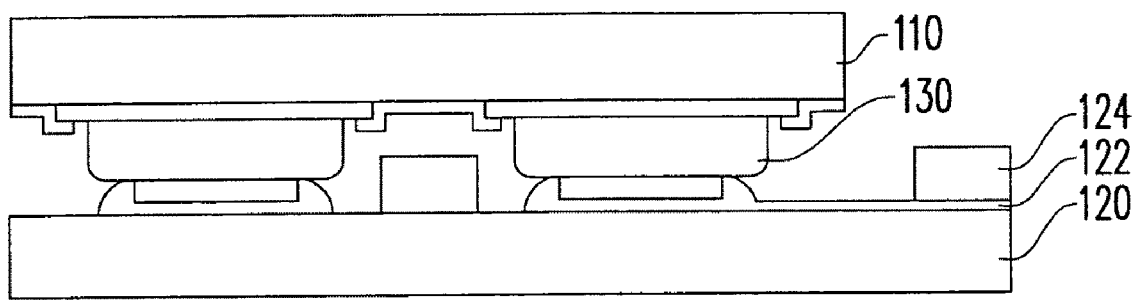
FIG. 1 is a schematic diagram of a conventional gold-tin flip chip package structure.
Figure 2:
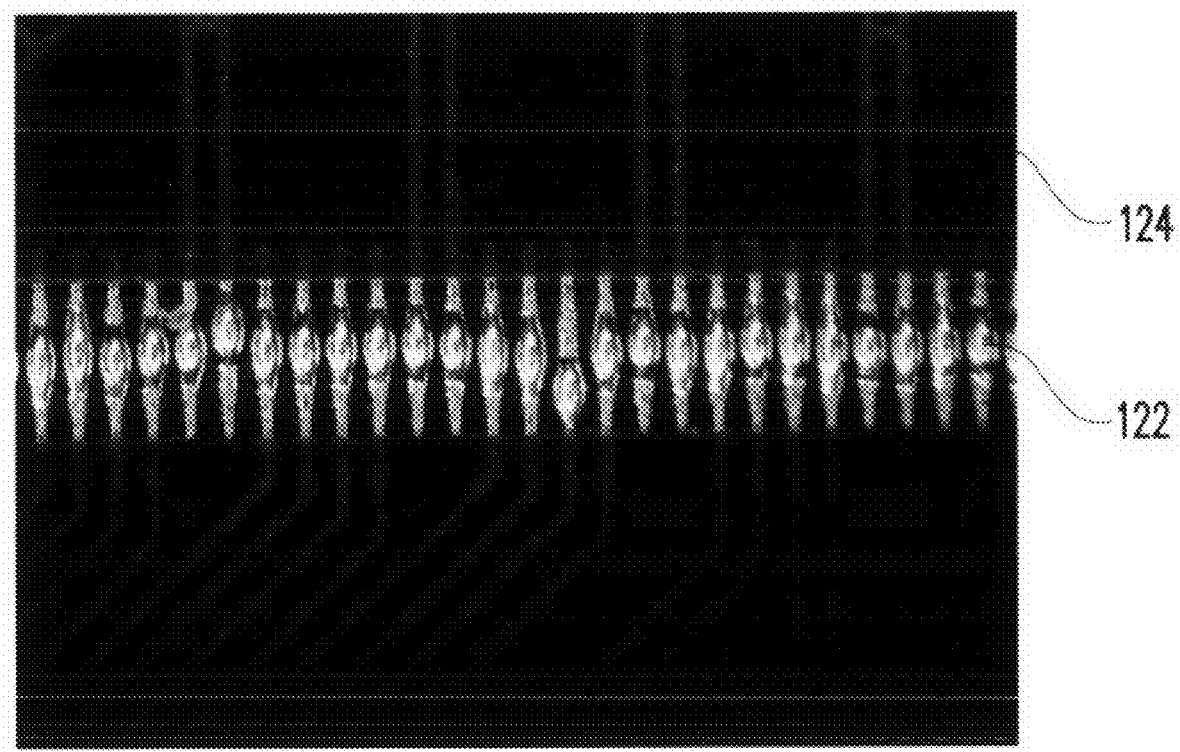
FIG. 2 illustrates a distribution of where the solder consolidates of a conventional gold-tin flip chip package structure after the reflow process.
Figure 3:
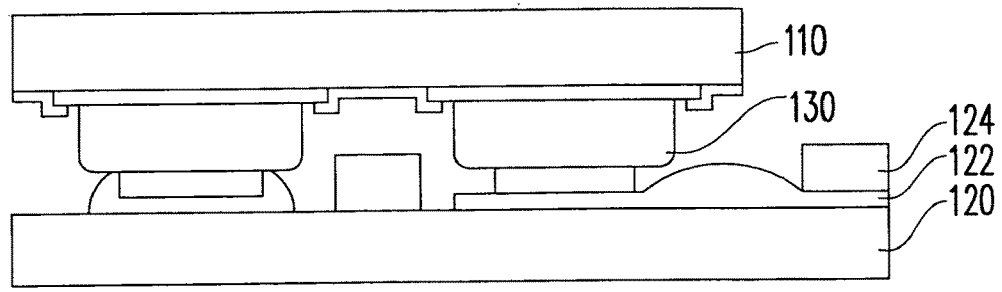
FIG. 3 is a schematic cross-sectional view illustrating a gold-tin flip chip package structure when the places where the solder bulges are away from the gold stud bumps.
Figure 8:
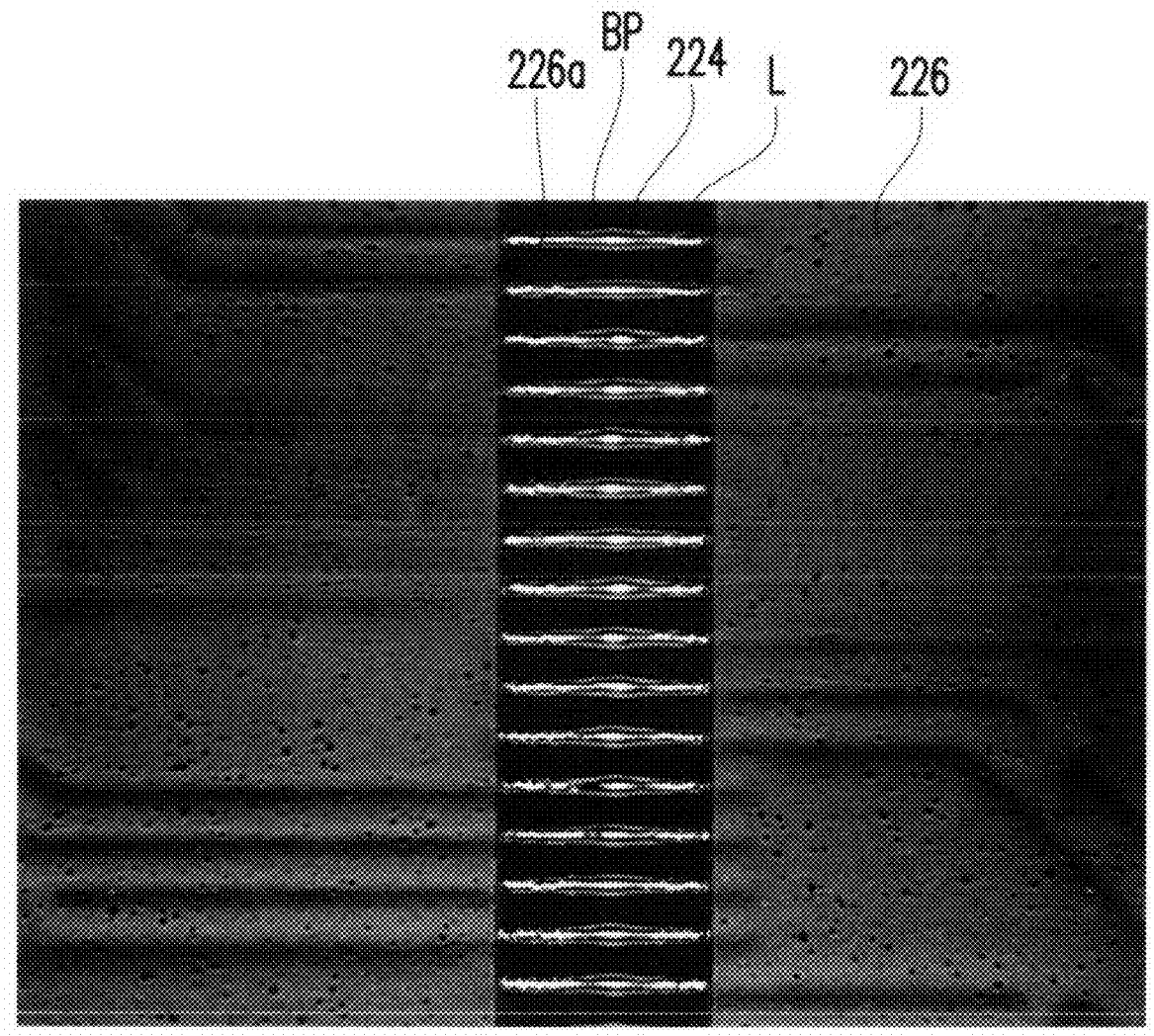
FIG. 8 illustrates a distribution of where the solder of the carrier of the present invention consolidates after the reflow process

FIG. 8 illustrates a distribution of where the solder of the carrier of the present invention consolidates after the reflow process. Clearly from FIG. 8, the pre-solders 224 above the trace L mainly consolidate at the bonding portions BP after the reflow process. Therefore, the solder bulges are arranged along a straight line and not irregularly as shown in FIG. 2.

In summary, the main feature of the flip chip package structure and the carrier thereof of the present invention lies in the design of an outward protruding bonding portion of each trace of the carrier such that the solder may consolidate on the bonding portion after the reflow process. The line width of the bonding portion is larger than that of the trace. The bonding portions are arranged along a straight line. The bonding portions have a greater area so the amount of the solders that may be coated thereon is also greater. Therefore, in the following reflow process, the solders have greater cohesive force and bulge as well as consolidate at the same positions so as to precisely bond with the bumps. As a result, the problem of poor gold-tin bonding resulted from unfixed places where the solders bulge in the conventional technology may be avoided and the yield of the flip chip package structure may be increased.

Although the present invention has been disclosed by the above embodiments, they are not intended to limit the present invention. Those skilled in the art may make some modifications and alterations without departing from the spirit and scope of the present invention. Therefore, the protection range of the present invention falls in the appended claims.

What is claimed is:

1. A carrier, suitable for a flip chip package process with a chip, wherein the chip comprises a plurality of bump pads, a bump is disposed on each of the bump pads, and the carrier comprises:

a substrate, comprising a carrying surface and a patterned trace layer disposed on the carrying surface, wherein the patterned trace layer comprises a plurality of traces, each of the traces which has an outward protruding bonding portion respectively corresponding to the bump and the line width of the bonding portion is greater than the line width of the trace, and the bonding portion and the main body of the trace form a cross-shaped structure; and a plurality of pre-solders, respectively disposed on the bonding portions.

2. The carrier according to claim 1, wherein the bonding portion is not disposed at the end of the trace.

3. The carrier according to claim 1, further comprising a solder mask disposed on the carrying surface of the substrate, wherein the solder mask has an opening to expose the bonding portions of the patterned trace layer.

4. A flip chip package structure, comprising:

a chip, comprising a bonding surface and a plurality of bump pads disposed on the bonding surface;

a carrier, disposed corresponding to the chip, comprising:

a substrate, comprising a carrying surface to carry the chip and a patterned trace layer disposed on the carrying surface, wherein the patterned trace layer comprises a plurality of traces, each of the traces which has an outward protruding bonding portion respectively corresponding to the bump and the line width of the bonding portion is greater than the line width of the trace, and the bonding portion and the main body of the trace form a cross-shaped structure; and a plurality of pre-solders, respectively disposed on the bonding portions; and a plurality of bumps, respectively disposed between the bump pads and the corresponding pre-solders such that the chip is electrically connected to the carrier through the bumps.

5. The flip chip package structure according to claim 4, wherein the bonding portion is not disposed at the end of the trace.

6. The flip chip package structure according to claim 4, wherein the bumps are stud bumps.

7. The flip chip package structure according to claim 4, wherein the carrier further comprises a solder mask disposed on the carrying surface of the substrate and the solder mask comprises an opening to expose the bonding portions of the patterned trace layer.

8. The flip chip package structure according to claim 4, further comprising an underfill disposed between the chip and the carrier, covering the bumps.

\* \* \* \* \*